US012361535B2

(12) United States Patent
Madmon et al.

(10) Patent No.: US 12,361,535 B2
(45) Date of Patent: Jul. 15, 2025

(54) MASK INSPECTION FOR SEMICONDUCTOR SPECIMEN FABRICATION

(71) Applicant: Applied Materials Israel Ltd., Rehovot (IL)

(72) Inventors: Ronen Madmon, Mazkeret Batia (IL); Ariel Shkalim, DN Sede-Gat (IL); Shani Ben Yacov, Tel Aviv (IL)

(73) Assignee: Applied Materials Israel Ltd., Rehovot (IL)

( * ) Notice: Subject to any disclaimer, the term of this patent is extended or adjusted under 35 U.S.C. 154(b) by 471 days.

(21) Appl. No.: 17/510,227

(22) Filed: Oct. 25, 2021

(65) Prior Publication Data
US 2023/0131950 A1 Apr. 27, 2023

(51) Int. Cl.
*G06T 7/00* (2017.01)
*G01N 21/956* (2006.01)
*G06T 7/60* (2017.01)
*G06T 7/73* (2017.01)
*G06V 10/24* (2022.01)
*G06V 10/75* (2022.01)

(52) U.S. Cl.
CPC ......... *G06T 7/0006* (2013.01); *G01N 21/956* (2013.01); *G06T 7/001* (2013.01); *G06T 7/60* (2013.01); *G06T 7/74* (2017.01); *G06V 10/245* (2022.01); *G06V 10/751* (2022.01); *G01N 2021/95676* (2013.01); *G06T 2207/30148* (2013.01); *G06V 10/759* (2022.01); *G06V 2201/06* (2022.01)

(58) Field of Classification Search
CPC ......... G06T 7/0006; G06T 7/001; G06T 7/60; G06T 7/74; G06T 2207/30148; G06T 7/0008; G06T 2207/10061; G06T 2207/20021; G06T 7/0004; G01N 21/956; G01N 2021/95676; G06V 10/245; G06V 10/751; G06V 10/759; G06V 2201/06; G06V 10/25; G03F 1/84; G03F 7/705; G03F 7/70625
See application file for complete search history.

(56) References Cited

U.S. PATENT DOCUMENTS 10,074,036 B2 * 9/2018 Liu .......................... G06T 7/41
2006/0291714 A1 * 12/2006 Wu ....................... G03F 7/7065
382/149

(Continued)

*Primary Examiner* — Nay A Maung
*Assistant Examiner* — Dustin Bilodeau
(74) *Attorney, Agent, or Firm* — Lowenstein Sandler LLP

(57) ABSTRACT

There is provided a system and method for mask inspection, comprising: obtaining a plurality of images, each representative of a respective part of the mask; generating a CD map of the mask comprising a plurality of composite values of a CD measurement of a POI respectively derived from the plurality of images, comprising, for each given image: dividing the given image into a plurality of sections; searching for the POI in the plurality of sections, giving rise to a set of sections, each with presence of at least one of the POI therein; for each section, obtaining a value of the CD measurement using a printing threshold, giving rise to a set of values of the CD measurement corresponding to the set of sections; and combining the set of values to a composite value of the CD measurement corresponding to the given image.

16 Claims, 7 Drawing Sheets

(56) References Cited

U.S. PATENT DOCUMENTS

| | | | | |
|---|---|---|---|---|
| 2008/0118852 A1* | 5/2008 | Mitsuhashi | ............... | G03F 1/68 |
| | | | | 430/30 |
| 2015/0144798 A1* | 5/2015 | Shi | ............................ | G03F 1/70 |
| | | | | 250/372 |
| 2017/0103924 A1* | 4/2017 | Park | ........................ | G03F 7/405 |
| 2019/0164852 A1* | 5/2019 | Peng | ................. | H01L 21/67253 |
| 2019/0347781 A1* | 11/2019 | Huang | ....................... | G06T 7/13 |
| 2023/0081821 A1* | 3/2023 | Batistakis | ........... | G03F 7/70491 |
| | | | | 382/145 |

\* cited by examiner

MASK INSPECTION FOR SEMICONDUCTOR SPECIMEN FABRICATION

TECHNICAL FIELD

The presently disclosed subject matter relates, in general, to the field of mask inspection, and more specifically, to critical dimension (CD) control with respect to a photomask.

BACKGROUND

Current demands for high density and performance associated with ultra large-scale integration of fabricated microelectronic devices require submicron features, increased transistor and circuit speeds, and improved reliability. As semiconductor processes progress, pattern dimensions such as line width, and other types of critical dimensions, are continuously shrunken. Such demands require formation of device features with high precision and uniformity, which, in turn, necessitates careful monitoring of the fabrication process, including automated examination of the devices while they are still in the form of semiconductor wafers.

Semiconductor devices are often manufactured using photo lithographic masks (also referred to as photomasks or masks or reticles) in a photolithography process. The photolithography process is one of the principal processes in the manufacture of semiconductor devices, and comprises patterning a wafer's surface in accordance with the circuit design of the semiconductor devices to be produced. Such a circuit design is first patterned on a mask. Hence, in order to obtain operating semiconductor devices, the mask must be defect free. Masks are manufactured by a complex process and can suffer from various defects and variations.

In addition, the mask is often used in a repeated manner to create many dies on the wafer. Thus, any defect on the mask will be repeated multiple times on the wafer and will cause multiple devices to be defective. Establishing a production-worthy process requires tight control of the overall lithography process, especially in view of the large scale of circuit integration and the decreasing size of semiconductor devices. Within this process, CD control is a determining factor with respect to device performance and yield. In particular, the masks and fabricated devices have become increasingly sensitive to CD uniformity variations. These variations, if uncorrected, may cause the final device to fail to meet the desired performance, and, in some cases, they may even cause the final device to malfunction, thus adversely affecting yield.

Various mask inspection methods have been developed and are available commercially. According to certain conventional techniques of designing and evaluating masks, the mask is created and used to expose therethrough a wafer, and then an inspection is performed to determine whether the features/patterns of the mask have been transferred to the wafer according to the design. Any variations in the final printed features from the intended design may necessitate modifying the design, repairing the mask, creating a new mask, and/or exposing a new wafer. Alternatively, a mask can be directly inspected using various mask inspection tools.

The verification of the accuracy and quality of the printed features permits an indirect method of verifying the mask. However, since the final printed pattern on the wafer or die is formed after the printing process, e.g., the resist development, the substrate treatment (such as material etching or deposition), etc., it may be difficult to attribute, discriminate or isolate errors in the final printed pattern to problems associated with the mask and/or the resist deposition and/or the developing processes. Moreover, inspecting the final printed pattern on the wafer or die tends to offer a limited number of samples usable to detect, determine, and resolve any processing issues. This process may also be labor intensive and requires extensive inspection and analysis time.

SUMMARY

In accordance with certain aspects of the presently disclosed subject matter, there is provided a computerized system of inspecting a mask usable for fabricating a semiconductor specimen, the system comprising a processing and memory circuitry (PMC) configured to: obtain a plurality of images each representative of a respective part of the mask, wherein the images are acquired by emulating optical configuration of a lithographic tool usable for fabrication of the semiconductor specimen; generate a critical dimension (CD) map of the mask comprising a plurality of composite values of a CD measurement of a pattern of interest (POI) respectively derived from the plurality of images, wherein the PMC is configured to derive a composite value from each given image of the plurality of images by: dividing the given image into a plurality of sections; searching for the POI in the plurality of sections, giving rise to a set of sections each with presence of at least one of the POI therein; for each section of the set of sections, obtaining a value of the CD measurement with respect to the at least one POI using a printing threshold, giving rise to a set of values of the CD measurement corresponding to the set of sections; and combining the set of values to a composite value of the CD measurement corresponding to the given image; wherein the CD map is indicative of CD uniformity (CDU) of the mask with respect to the CD measurement of the POI.

In addition to the above features, the system according to this aspect of the presently disclosed subject matter can comprise one or more of features (i) to (xi) listed below, in any desired combination or permutation which is technically possible:

(i). The mask is a memory mask or a logic mask.
(ii). The plurality of images are acquired by an actinic inspection tool configured to emulate the optical configuration of the lithographic tool.
(iii). The plurality of images are obtained by: acquiring a plurality of first images using a non-actinic inspection tool, and performing simulation on the plurality of first images to simulate the optical configuration of the lithographic tool, giving rise to the plurality of images.
(iv). The CD measurement is selected in accordance with a specific inspection application.
(v). The given image is divided into the plurality of sections according to a grid, and the grid is determined based on dimension and periodicity of the POI.
(vi). The POI is searched by using a pattern matching algorithm with respect to a reference image of the POI.
(vii). The PMC is configured to obtain the value of the CD measurement for each section by: deriving a gray level (GL) profile of the at least one POI from the section, the GL profile indicative of pixel intensity distribution of the at least one POI, applying the printing threshold on the GL profile to obtain two topo-points, and performing the CD measurement based on the two topo-points to obtain the value thereof.

(viii). The PMC is configured to obtain the value of the CD measurement for each section by: applying the printing threshold on at least a portion of the section comprising the at least one POI, giving rise to a binary image portion, and performing the CD measurement on the binary image portion to obtain the value thereof.

(ix). The PMC is configured to generate one or more CD maps corresponding to one or more CD measurements of the POI in accordance with a specific inspection application, each CD map comprising a plurality of composite values of a CD measurement of the one or more CD measurements respectively derived from the plurality of images.

The PMC is configured to derive one or more composite values from each given image of the plurality of images including, for each section of the set of sections, obtaining one or more values for the one or more CD measurements, giving rise to one or more sets of values for the one or more CD measurements corresponding to the set of sections, and respectively combining each set of the one or more sets of values to one or more composite values corresponding to the given image.

(x). The PMC is further configured to determine CD variance of the mask based on the CD map, and report presence of a defect with respect to CDU upon the CD variance passing a CDU threshold.

(xi). The PMC is further configured to determine whether to accept the mask, correct the mask, or reject the mask in response to the presence of the defect with respect to CDU.

In accordance with other aspects of the presently disclosed subject matter, there is provided a method of inspecting a mask usable for fabricating a semiconductor specimen, the method performed by a processing and memory circuitry (PMC) and comprising: obtaining a plurality of images, each representative of a respective part of the mask, wherein the images are acquired by emulating optical configuration of a lithographic tool usable for fabrication of the semiconductor specimen; generating a critical dimension (CD) map of the mask comprising a plurality of composite values of a CD measurement of a pattern of interest (POI) respectively derived from the plurality of images, comprising deriving a composite value from each given image of the plurality of images by: dividing the given image into a plurality of sections; searching for the POI in the plurality of sections, giving rise to a set of sections, each with presence of at least one of the POI therein; for each section of the set of sections, obtaining a value of the CD measurement with respect to the at least one POI using a printing threshold, giving rise to a set of values of the CD measurement corresponding to the set of sections; and combining the set of values to a composite value of the CD measurement corresponding to the given image; wherein the CD map is indicative of CD uniformity (CDU) of the mask with respect to the CD measurement of the POI.

This aspect of the disclosed subject matter can comprise one or more of features (i) to (xi) listed above with respect to the system, mutatis mutandis, in any desired combination or permutation which is technically possible.

In accordance with other aspects of the presently disclosed subject matter, there is provided a non-transitory computer readable medium comprising instructions that, when executed by a computer, cause the computer to perform a method of inspecting a mask usable for fabricating a semiconductor specimen, the method comprising: obtaining a plurality of images each representative of a respective part of the mask, wherein the images are acquired by emulating optical configuration of a lithographic tool usable for fabrication of the semiconductor specimen; generating a critical dimension (CD) map of the mask comprising a plurality of composite values of a CD measurement of a pattern of interest (POI) respectively derived from the plurality of images, comprising deriving a composite value from each given image of the plurality of images by: dividing the given image into a plurality of sections; searching for the POI in the plurality of sections, giving rise to a set of sections, each with presence of at least one of the POI therein; for each section of the set of sections, obtaining a value of the CD measurement with respect to the at least one POI using a printing threshold, giving rise to a set of values of the CD measurement corresponding to the set of sections; and combining the set of values to a composite value of the CD measurement corresponding to the given image; wherein the CD map is indicative of CD uniformity (CDU) of the mask with respect to the CD measurement of the POI.

This aspect of the disclosed subject matter can comprise one or more of features (i) to (xi) listed above with respect to the system, mutatis mutandis, in any desired combination or permutation which is technically possible.

BRIEF DESCRIPTION OF THE DRAWINGS

In order to understand the disclosure and to see how it may be carried out in practice, embodiments will now be described, by way of non-limiting example only, with reference to the accompanying drawings, in which.

DETAILED DESCRIPTION OF EMBODIMENTS

Figure 1:
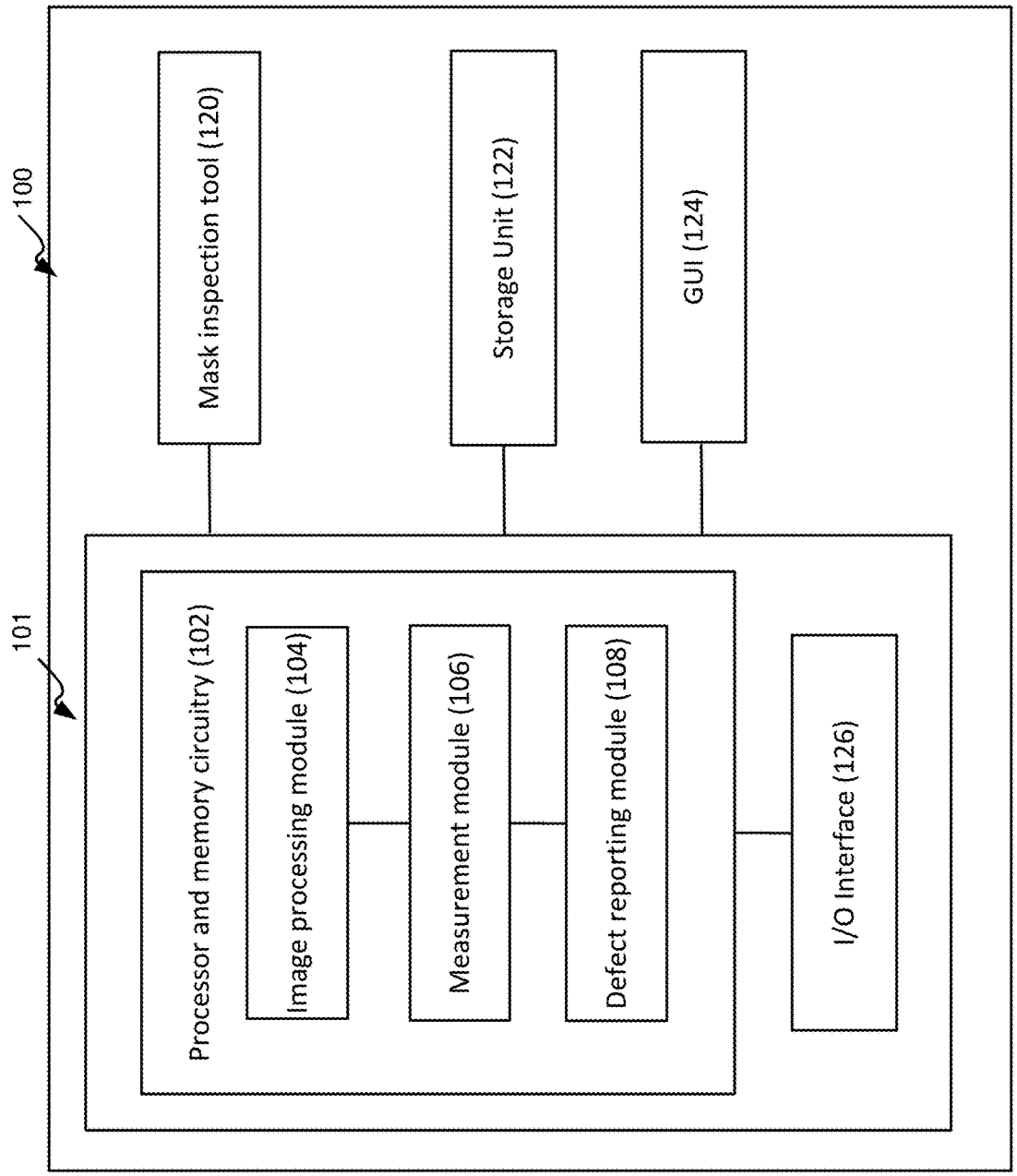
FIG. 1 illustrates a functional block diagram of a mask inspection system in accordance with certain embodiments of the presently disclosed subject matter.

In the following detailed description, numerous specific details are set forth in order to provide a thorough understanding of the disclosure. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "inspecting", "obtaining", "emulating", "applying", "generating", "deriving", "dividing", "searching", "combining", "acquiring", "performing", "determining", "reporting", or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the mask inspection system, the mask CD uniformity (CDU) system, and respective parts thereof disclosed in the present application.

The term "mask" used in this specification is also referred to as "photolithographic mask", or "photomask", or "reticle". Such terms should be construed equivalently and expansively to cover a template holding circuit design (e.g., defining the layout of a specific layer of an integrated circuit) to be patterned on a semiconductor wafer in a photolithography process. By way of example, a mask can be implemented as a fused silica plate covered with a pattern of opaque, transparent and phase-shifting areas which are projected onto wafers in the lithography process. By way of example, a mask can be an Extreme Ultraviolet (EUV) mask or an Argon Fluoride (ArF) mask. By way of another example, a mask can be a memory mask (usable for fabricating a memory device) or a logic mask (usable for fabricating a logic device).

The term "inspection" or "mask inspection" used in this specification should be expansively construed to cover any operation for assessing the accuracy and integrity of a fabricated photomask with respect to the circuit design and its ability to produce an accurate representation of the circuit design onto the wafer. The inspection can include any kind of operations related to defect detection, defect review and/or defect classification of various types, and/or metrology operations during and/or after the mask fabrication process and/or during the usage of the mask for semiconductor specimen fabrication. Inspection can be provided by using non-destructive inspection tools after fabrication of the mask. By way of non-limiting example, the inspection process can include one or more of the following operations: scanning (in a single or in multiple scans), imaging, sampling, detecting, measuring, classifying and/or other operations provided with regard to the mask or parts thereof, using an inspection tool. Likewise, mask inspection can also be construed to include, for example, generating an inspection recipe(s) and/or other setup operations, prior to the actual inspection of the mask. It is noted that, unless specifically stated otherwise, the term "inspection" or its derivatives used in this specification are not limited with respect to resolution or size of an inspection area. A variety of non-destructive inspection tools includes, by way of non-limiting example, optical inspection tools, scanning electron microscopes, atomic force microscopes, etc.

The term "metrology operation" used in this specification should be expansively construed to cover any metrology operation procedure used to extract metrology information relating to one or more structural elements on a mask. In some embodiments, the metrology operations can include measurement operations, such as, e.g., critical dimension (CD) measurements performed with respect to certain structural elements on the specimen, including but not limiting to the following: dimensions (e.g., line widths, line spacing, contact diameters, size of the element, edge roughness, gray level statistics, etc.), shapes of elements, distances within or between elements, related angles, overlay information associated with elements corresponding to different design levels, etc. Measurement results such as measured images are analyzed, for example, by employing image-processing techniques. Note that, unless specifically stated otherwise, the term "metrology" or derivatives thereof used in this specification are not limited with respect to measurement technology, measurement resolution, or size of inspection area.

The term "specimen" used in this specification should be expansively construed to cover any kind of wafers, related structures, combinations and/or parts thereof used for manufacturing semiconductor integrated circuits, magnetic heads, flat panel displays, and other semiconductor-fabricated articles.

The term "defect" used in this specification should be expansively construed to cover any kind of abnormality or undesirable feature/functionality formed on a mask. A defect in some cases can refer to a real defect or a defect of interest (DOI) which, when printed on the wafer, has certain effects on the functionality of the fabricated device, thus it is in the customer's interest to detect such. In some other cases, a defect can refer to a nuisance or "false alarm" defect which is a suspected defect that can be disregarded because it has no effect on the functionality of the completed device.

The terms "non-transitory memory" and "non-transitory storage medium" used herein should be expansively construed to cover any volatile or non-volatile computer memory suitable to the presently disclosed subject matter. The terms should be taken to include a single medium or multiple media (e.g., a centralized or distributed database, and/or associated caches and servers) that store the one or more sets of instructions. The terms shall also be taken to include any medium that is capable of storing or encoding a set of instructions for execution by the computer and that cause the computer to perform any one or more of the methodologies of the present disclosure. The terms shall accordingly be taken to include, but not be limited to, a read only memory ("ROM"), random access memory ("RAM"), magnetic disk storage media, optical storage media, flash memory devices, etc.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Bearing this in mind, attention is drawn to FIG. 1 illustrating a functional block diagram of a mask inspection system in accordance with certain embodiments of the presently disclosed subject matter.

The inspection system 100 illustrated in FIG. 1 can be used for inspection of a mask during or after the mask fabrication process, and/or during the semiconductor specimen fabrication process, using the mask. As described above, the inspection referred to herein can be construed to cover any kind of operations related to defect inspection/detection, and/or defect classification of various types, and/or metrology operations, such as, e.g., critical dimension (CD) measurements, with respect to the mask or parts thereof. According to certain embodiments of the presently disclosed subject matter, the illustrated inspection system 100 comprises a computer-based system 101 capable of automatically inspecting and detecting defects on the mask. Specifically, in some embodiments, the defects to be detected in the present disclosure relate to CD uniformity (CDU) of a mask. In such cases, system 101 is configured to automatically monitor the CD uniformity of a mask and detect defects with respect to CDU upon presence thereof. System 101 is also referred to as a mask defect detection system, or more specifically, a mask CDU system, which is a sub-system of the inspection system 100.

System 101 can be operatively connected to a mask inspection tool 120 which is configured to scan a mask and capture one or more images thereof for inspection of the mask. The term "mask inspection tool" used herein should be expansively construed to cover any type of inspection tools that can be used in mask inspection related processes, including, by way of non-limiting example, scanning (in a single or in multiple scans), imaging, sampling, detecting, measuring, classifying and/or other processes provided with regard to the mask or parts thereof.

Without limiting the scope of the disclosure in any way, it should also be noted that the mask inspection tool 120 can be implemented as inspection machines of various types, such as optical inspection tools, electron beam tools, and so on. In some cases, the mask inspection tool 120 can be a relatively low-resolution inspection tool (e.g., an optical inspection tool, a low-resolution Scanning Electron Microscope (SEM), etc.). In some cases, the mask inspection tool 120 can be a relatively high-resolution inspection tool (e.g., a high-resolution SEM, an Atomic Force Microscopy (AFM), a Transmission Electron Microscope (TEM), etc.). In some cases, the inspection tool can provide both low-resolution image data and high-resolution image data. In some embodiments, the mask inspection tool 120 has metrology capabilities and can be configured to perform metrology operations on the captured images. The resulting image data (low-resolution image data and/or high-resolution image data) can be transmitted—directly or via one or more intermediate systems—to system 101. The present disclosure is not limited to any specific type of mask inspection tools and/or the resolution of image data resulting from the inspection tools.

According to certain embodiments, the mask inspection tool can be implemented as an actinic inspection tool configured to emulate/mimic optical configurations of a lithographic tool (such as, e.g., a scanner or a stepper) usable for fabrication of a semiconductor specimen, e.g., by projecting a pattern formed in a mask onto a wafer, as described below in further detail with respect to FIG. 5.

Figure 5:
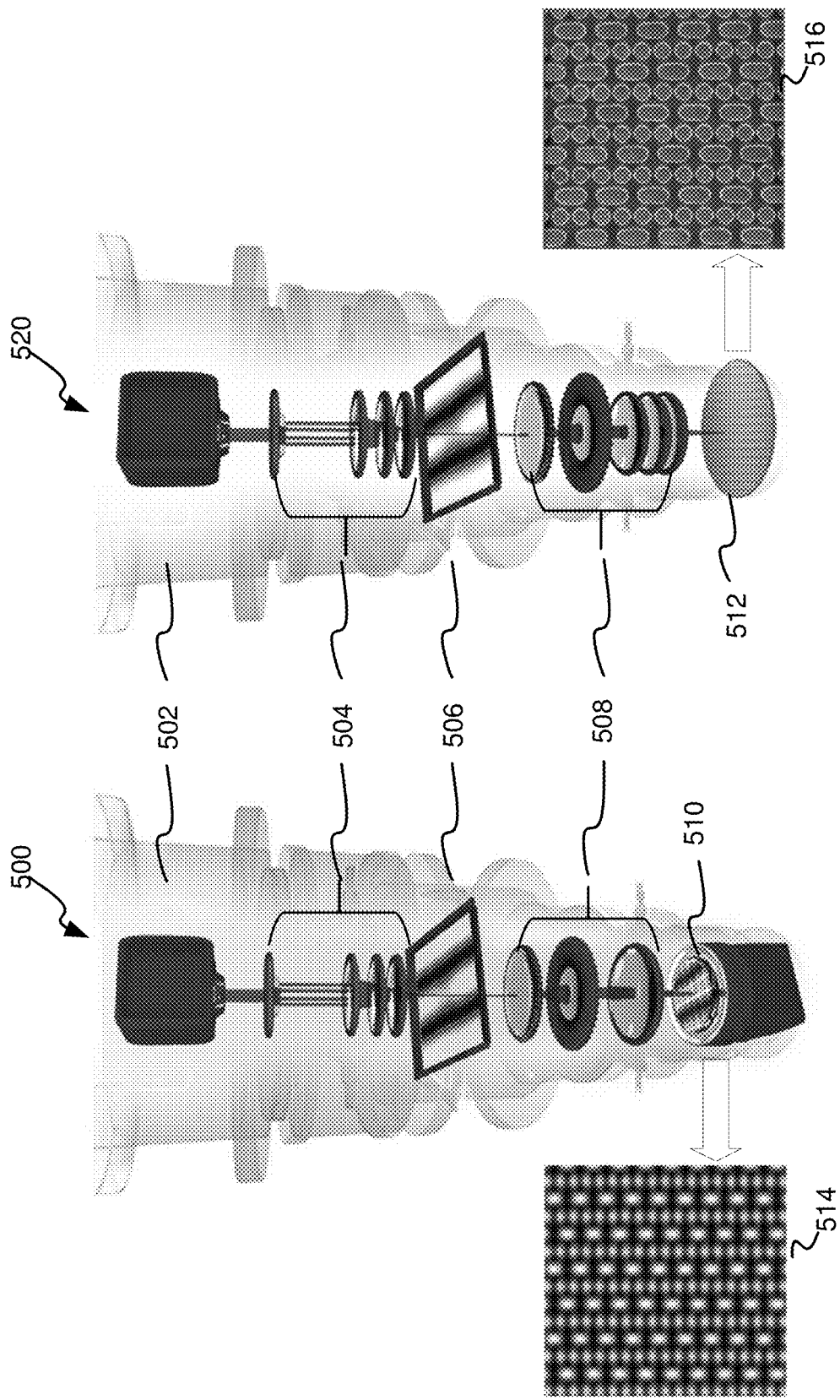
FIG. 5 illustrates a schematic illustration of an actinic inspection tool and a lithographic tool in accordance with certain embodiments of the presently disclosed subject matter.

Turning now to FIG. 5, there is shown a schematic illustration of an actinic inspection tool and a lithographic tool in accordance with certain embodiments of the presently disclosed subject matter.

Similar to a lithographic tool 520, an actinic inspection tool 500 may include an illumination source 502 configured to generate light (e.g., laser) at an exposure wavelength, illumination optics 504, mask holder 506, and projection optics 508. The illumination optics 504 and projection optics 508 may include one or more optical elements (such as, e.g., a lens, aperture, a spatial filter, etc.).

In a lithographic tool 520, a mask is positioned at the mask holder 506 and optically aligned to project an image of the circuit pattern to be duplicated onto a wafer placed on the wafer holder 512 (e.g., by employing various stepping, scanning and/or imaging techniques to produce or replicate the pattern on the wafer). Unlike the lithographic tool 520, instead of placing a wafer holder 512, the actinic inspection tool 500 places a detector 510 (such as, e.g., charge-coupled device (CCD)) at the location of the wafer holder, where the detector 510 is configured to detect the light that is projected through the mask and generate an image of the mask.

As can be seen, the actinic inspection tool 500 is configured to emulate optical configurations of the lithographic tool 520, including but not limited to, e.g., illumination/exposure conditions such as wavelength, pupil shape, numerical aperture (NA), etc. Therefore, the mask image 514 acquired by the detector 510 is expected to resemble an image 516 of a wafer that would be fabricated using the mask via the lithographic tool. A mask image acquired using such an actinic inspection tool is also referred to as an aerial image. The aerial image is provided to system 101 for further processing, as described below.

According to certain embodiments, in some cases, the mask inspection tool 120 can be implemented as a non-actinic inspection tool, such as, e.g., a regular optical inspection tool, an electron beam tool (e.g., SEM), etc. In such cases, the detector of the inspection tool is capable of interfacing with the particular type of microscope used and digitizing the image information from the microscope, thereby acquiring an image of the mask.

Simulation can be performed on the acquired image to simulate the optical configuration of the lithographic tool, thereby generating an aerial image. In some cases, the image simulation can be performed by the system 101 (e.g., the functionality of the simulation can be integrated into the PMC 102 thereof, by incorporating an image simulator in the PMC 102), while in some other cases, the image simulation can be performed by a processing module of the mask inspection tool 120, or by a separate simulation engine/unit which is operatively connected to the mask inspection tool 120 and system 101.

System 101 includes a processor and memory circuitry (PMC) 102 operatively connected to a hardware-based I/O interface 126. PMC 102 is configured to provide processing necessary for operating the system, as further detailed with reference to FIGS. 2, 3 and 4, and comprises a processor (not shown separately) and a memory (not shown separately). The processor of PMC 102 can be configured to execute several functional modules in accordance with computer-readable instructions implemented on a non-transitory computer-readable memory comprised in the PMC. Such functional modules are referred to hereinafter as comprised in the PMC.

The processor referred to herein can represent one or more general-purpose processing devices such as a microprocessor, a central processing unit, or the like. More particularly, the processor may be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processor may also be one or more special-purpose processing devices such as an application specific integrated circuit (ASIC), a field programmable gate array (FPGA), a digital signal processor (DSP), a network processor, or the like. The processor is configured to execute instructions for performing the operations and steps discussed herein.

The memory referred to herein can comprise a main memory (e.g., read-only memory (ROM), flash memory, dynamic random access memory (DRAM) such as synchronous DRAM (SDRAM) or Rambus DRAM (RDRAM), etc.), and a static memory (e.g., flash memory, static random access memory (SRAM), etc.).

As aforementioned, in some embodiments, system 101 can be configured to detect defects related to CD uniformity on a mask. The term "CD uniformity (CDU)" used herein refers to the variances of a CD measurement across the entirety of a mask (or at least part thereof). Such CD variances may be caused by certain physical effect(s) during the mask writing process, such as, e.g., spatial writing errors of a mask fabrication tool which may be caused by factors like variance of laser energy, materials of the mask, etc. Mask defects related to CDU, if not detected prior to mass production of wafers, will be repeated multiple times on the production wafers, thus causing multiple semiconductor devices to be defective (e.g., affecting the functionality of the devices and failing to meet the desired performance), thus adversely affecting the yield. Therefore, it is desirable to keep the CD variances to be tightly controlled.

To minimize the effect of CD variations on a mask, certain conventional techniques use the mask to print multiple wafers to determine the best lithographic parameters to be used with respect to the mask. However, this repetitive process is extremely time-consuming as the number of parameter variables to consider is large and their interaction is complicated. Moreover, using the wafer fabrication tools repetitively and merely for optimizing parameters would unnecessarily reduce the time that the tools can be used for their intended function, i.e., to fabricate integrated circuits.

Alternative approaches utilize a linear correlation relationship between CD measurements and pixel intensities of the mask image. The CD variance is indirectly measured by calculating pixel intensities, e.g., by averaging the gray level intensities over a certain area of the image. However, the correlation coefficient (or conversion factor) k is typically unknown, as it varies with respect to many factors such as, e.g., the pattern of interest, the type of resist, etc. Therefore, without knowing k, it is not possible to infer the actual CD measurement based on the image intensities. Attempts have been made to learn the value of k, which have proven to be complicated and time consuming considering the number of relevant variables. In addition, the above mentioned approaches average the pixel intensities over a relatively large image area, thus are only applicable to memory masks where the features are widely repetitive across the mask.

Therefore, current inspection methodologies are not sufficient for providing desired CD control of a mask, in particular with respect to the fast development of advanced processes and complex features of photomasks. According to certain embodiments of the presently disclosed subject matter, there is proposed an improved mask inspection system and method configured to automatically monitor the CD uniformity (CDU) of a mask and detect defects with respect to CDU of the mask. The proposed method has proved to have improved accuracy and sensitivity for advanced CD control of the mask features, while not affecting the inspection throughput.

According to certain embodiments, the functional modules comprised in PMC 102 of system 101 can include an image processing module 104, a measurement module 106 and a defect reporting module 108. The PMC 102 can be configured to obtain, via I/O interface 126, a plurality of images, each representative of a respective part (e.g., a portion) of the mask. The images can be acquired by emulating optical configuration of a lithographic tool usable for fabrication of the semiconductor specimen. By way of example, the images can be acquired by the mask inspection tool 120, such as, e.g., an actinic inspection tool.

The PMC 102 can be further configured to generate a critical dimension (CD) map of the mask comprising a plurality of composite values of a CD measurement of a pattern of interest (POI). The plurality of composite values are respectively derived from the plurality of images. Specifically, the PMC 102 is configured to derive a composite value from each given image of the plurality of images, as described below.

The image processing module 104 can be configured to divide the given image into a plurality of sections, and search for the POI in the plurality of sections, giving rise to a set of sections, each with presence of at least one of the POI therein.

The measurement module 106 can be configured to obtain, for each section of the set of sections, a value of the CD measurement with respect to the at least one POI using a printing threshold, giving rise to a set of values of the CD measurement corresponding to the set of sections. The measurement module 106 is further configured to combine the set of values to a composite value of the CD measurement corresponding to the given image.

The CD map generated as such is indicative of CD uniformity of the mask with respect to the CD measurement of the POI. Optionally, the defect reporting module 108 can be configured to report the presence of a defect with respect to CDU upon a CD variance indicated by the CD map passing a CDU threshold (e.g., in some cases exceeding the threshold, while in some other cases below the threshold). Optionally, the defect reporting module 108 can be further configured to determine how to respond to the detected defect, e.g., whether to accept the mask, repair the mask, or reject the mask.

Operations of systems 100, 101, PMC 102 and the functional modules therein, will be further detailed with reference to FIGS. 2, 3 and 4.

According to certain embodiments, system 100 can comprise a storage unit 122. The storage unit 122 can be configured to store any data necessary for operating systems 100 and 101, e.g., data related to input and output of systems 100 and 101, as well as intermediate processing results generated by system 101. By way of example, the storage unit 122 can be configured to store the images produced by the mask inspection tool 120 and/or derivatives thereof (e.g., images after pre-processing). Accordingly, the images can be retrieved from the storage unit 122 and provided to the PMC 102 for further processing.

In some embodiments, system 100 can optionally comprise a computer-based Graphical User Interface (GUI) 124 which is configured to enable user-specified inputs related to system 101. For instance, the user can be presented with a visual representation of the mask (for example, by a display forming part of GUI 124), including images of the mask or parts thereof. The user may be provided, through the GUI, with options of defining certain operation parameters, such as, e.g., a POI, a printing threshold, a CD variation threshold, etc. In some cases, the user may also view operation results, such as the CD map, detected defect(s) with respect to CDU, and/or further examination results on the GUI.

As described above, system 101 is configured to receive, via I/O interface 126, a plurality of images of the mask. The images can include image data (and/or derivatives thereof) produced by the mask inspection tool 120 and/or image data stored in the storage unit 122 or one or more data depositories. In some cases, image data can refer to images captured by the mask inspection tool, and/or pre-processed images derived from the captured images as obtained by various pre-processing stages, etc. It is noted that in some cases the images can include associated numeric data (e.g., metadata, hand-crafted attributes, etc.). It is further noted that the image data relates to a target layer of a semiconductor device to be printed on the wafer.

System 101 is further configured to process the received images and send, via I/O interface 126, the results (e.g., the CD map, the detected defect(s)) to the storage unit 122, and/or the GUI 124 for rendering, and/or the mask inspection tool 120.

In some embodiments, additionally to system 101, the mask inspection system 100 can further comprise one or more inspection modules, such as, e.g., additional defect detection module(s) and/or Automatic Defect Review Module (ADR) and/or Automatic Defect Classification Module (ADC) and/or metrology-related module and/or other inspection modules which are usable for performing additional inspection of a mask. The one or more inspection modules can be implemented as stand-alone computers, or their functionalities (or at least some thereof) can be integrated with the mask inspection tool 120. In some embodiments, the output as obtained from system 101 can be used by the mask inspection tool 120 and/or the one or more inspection modules (or part thereof) for further inspection of the mask.

Those versed in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and/or hardware.

It is noted that the mask inspection system illustrated in FIG. 1 can be implemented in a distributed computing environment, in which the aforementioned functional modules as comprised in the PMC 102 can be distributed over several local and/or remote devices, and can be linked through a communication network. It is further noted that in other embodiments one or more of the mask inspection tool 120, storage unit 122 and/or GUI 124 may be external to system 100 and operate in data communication with system 101 via I/O interface 126. System 101 can be implemented as stand-alone computer(s) to be used in conjunction with the mask inspection tool. Alternatively, the respective functions of the system 101 can, at least partly, be integrated with the mask inspection tool 120, thereby facilitating and enhancing the functionalities of the mask inspection tool 120 in inspection-related processes.

Figure 2:
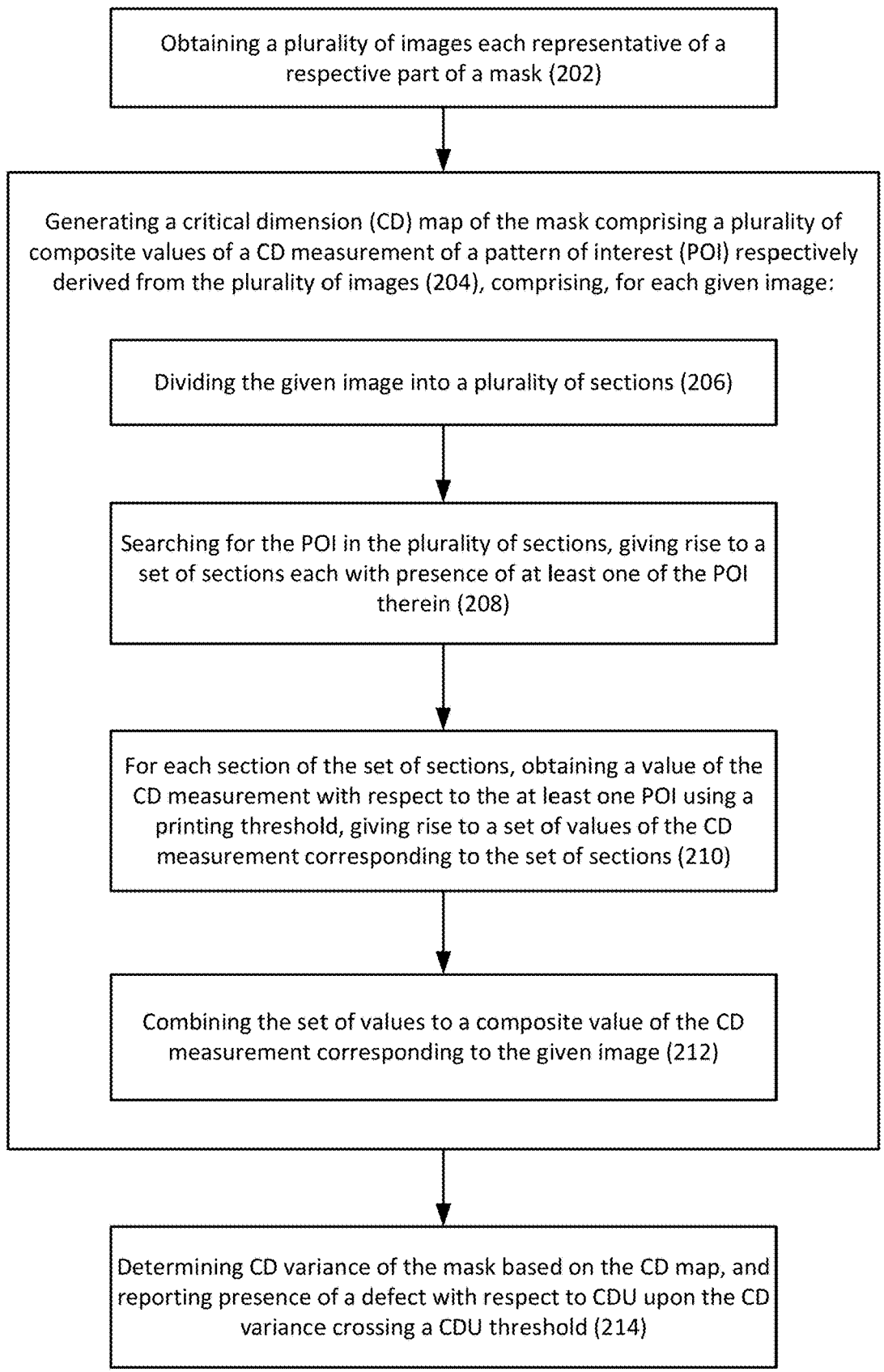
FIG. 2 illustrates a generalized flowchart of mask inspection for a mask usable for fabricating a semiconductor specimen in accordance with certain embodiments of the presently disclosed subject matter.
Figure 3:
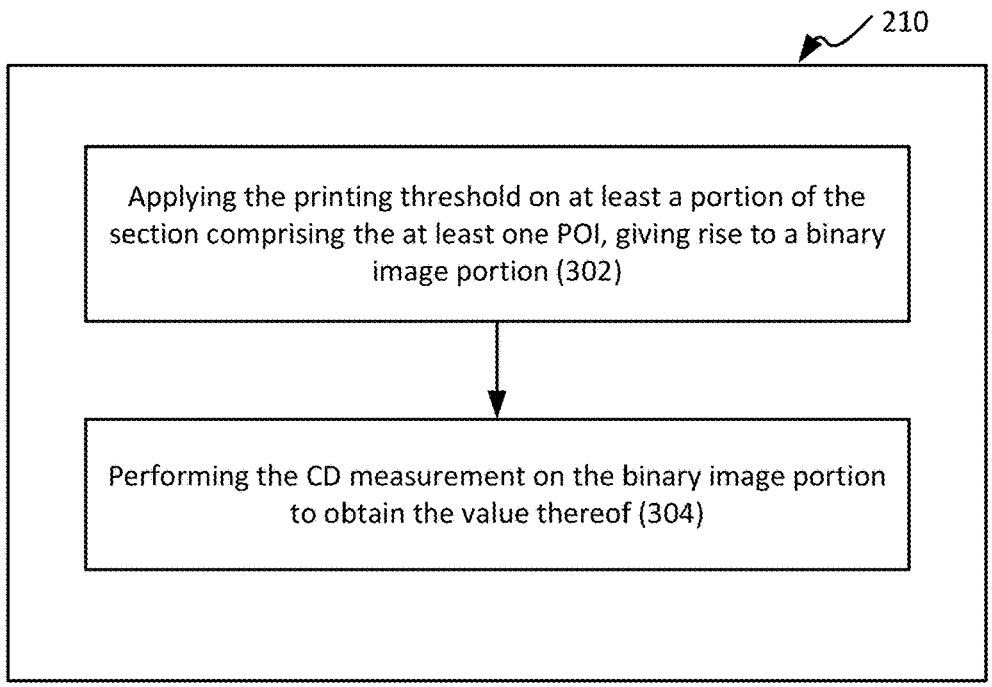
FIG. 3 illustrates a generalized flowchart of one example of obtaining a value of the CD measurement for each section in accordance with certain embodiments of the presently disclosed subject matter.
Figure 4:
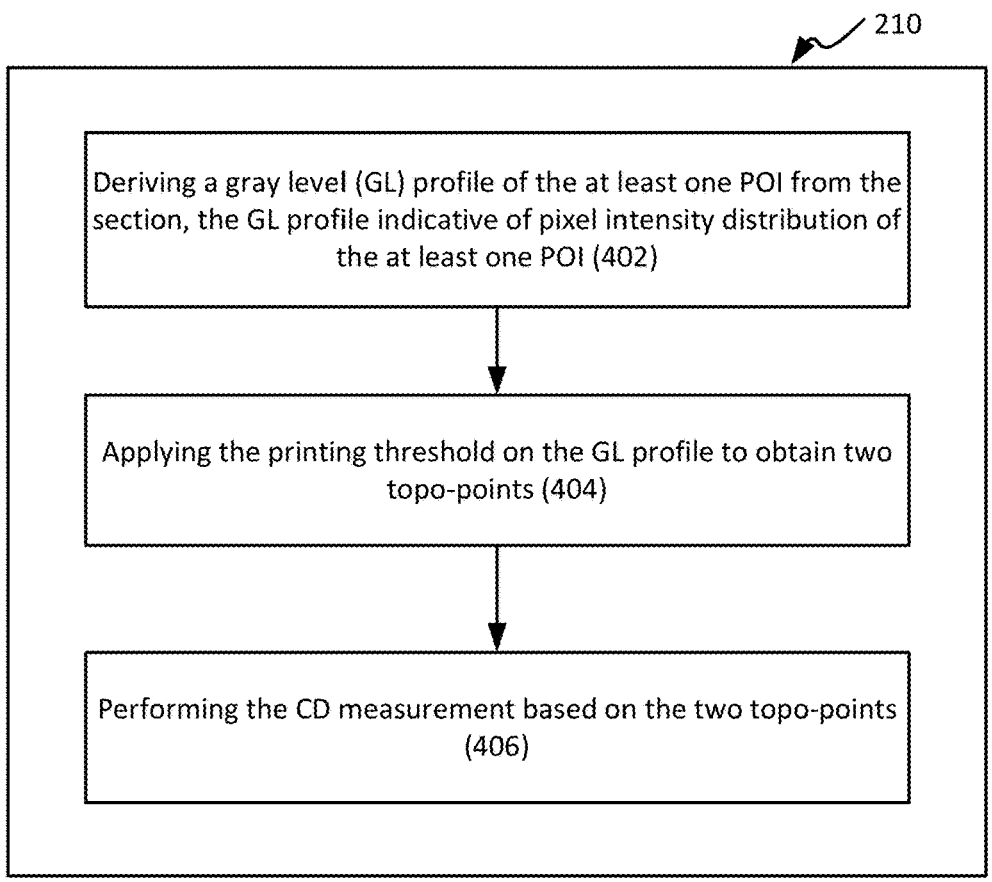
FIG. 4 illustrates a generalized flowchart of another example of obtaining a value of the CD measurement for each section in accordance with certain embodiments of the presently disclosed subject matter.

While not necessarily so, the process of operation of systems 101 and 100 can correspond to some or all of the stages of the methods described with respect to FIGS. 2-4. Likewise, the methods described with respect to FIGS. 2-4 and their possible implementations can be implemented by systems 101 and 100. It is therefore noted that embodiments discussed in relation to the methods described with respect to FIGS. 2-4 can also be implemented, mutatis mutandis as various embodiments of the systems 101 and 100, and vice versa.

Referring now to FIG. 2, there is illustrated a generalized flowchart of mask inspection for a mask usable for fabricating a semiconductor specimen in accordance with certain embodiments of the presently disclosed subject matter.

A plurality of images can be obtained (202) (e.g., by the PMC 102 via I/O interface 126, from the mask inspection tool 120 or from the storage unit 122) each representative of a respective part of the mask. The images can be acquired by emulating optical configuration of a lithographic tool usable for fabrication of the semiconductor specimen. In some embodiments, a region of interest (ROI) to be inspected on the mask can be predefined and the plurality of images can be acquired for the ROI. For instance, in some cases, the ROI can be defined as the entire mask, while in some other cases, the ROI can be defined as part of the mask.

In some embodiments, the images are acquired by an actinic mask inspection tool, such as, e.g., the Aera Mask Inspection tool of Applied Materials Inc. As described above with reference to FIG. 5, the actinic mask inspection tool is specifically configured to emulate the optical configurations of a lithographic tool (e.g., a scanner or a stepper) used for fabrication of the semiconductor wafers in accordance with the mask. The optical configurations to be emulated can include one or more of the following illumination/exposure conditions such as, e.g., wavelength, pupil shape, numerical aperture (NA), etc.

The mask images acquired by such an actinic inspection tool are expected to resemble images of a wafer that is fabricated using the mask via the lithographic tool, thus are also referred to as aerial images. In other words, the actinic mask inspection tool is configured so as to capture mask images which can mimic how the design patterns in the mask would actually appear in a physical wafer after the fabrication process.

In some cases, an actinic inspection tool may not be available for inspecting the mask. In such cases, a non-actinic inspection tool, such as, e.g., a regular optical inspection tool, an electron beam tool, etc., can be used to acquire non-aerial images (referred to herein as first images) of the mask. Simulation can be performed on the acquired non-aerial images to simulate the optical configurations of the lithographic tool, thereby generating aerial images of the mask. Accordingly, in some embodiments, the mask inspection method as described with reference to FIG. 2 can further comprise the preliminary steps of obtaining a plurality of first images acquired by a non-actinic inspection tool, and performing simulation (e.g., by the image processing module 104 of PMC 102, or by a processing module of the mask inspection tool 120, etc.) on the first images to simulate the optical configuration of the lithographic tool, giving rise to the plurality of images (i.e., aerial images).

In some embodiments, during inspection, the mask can move at a step size relative to the detector of the mask inspection tool (or the mask and the tool can move in opposite directions to each other) during the exposure, and the mask can be scanned step-by-step along swaths of the mask by the mask inspection tool which images only a part/portion of the mask (within a swath) at a time. For instance, at each step, light can be detected from a rectangular portion of the mask and such detected light is converted into multiple intensity values at multiple points in the portion, thereby forming an image corresponding to the part/portion of the mask. In one example, each image corresponding to a rectangular portion of the mask can be about 1000 pixels in length and 1000 pixels in width.

Therefore, a plurality of images of the mask can be sequentially obtained during the sequential scanning along the swaths of the mask, each representative of a respective part/portion of the mask. For example, a first swath of the mask can be scanned from left to right to obtain a first set of images. A second swath is then scanned from right to left to obtain a second set of images, so on and so forth, until the entire mask is scanned. The multiple sets of images constitute the plurality of images of the mask. In some cases, the plurality of images can be acquired with a step size which is predefined, such that the plurality of fields of view (FOVs) of the plurality of images do not overlap. In some other cases, the step size can be defined so that the FOVs of the plurality of images partially overlap.

In some embodiments, the plurality of images as obtained may be pre-processed prior to the further processing, as will be described with reference to FIG. 2. The pre-processing may include one or more of the following operations: interpolation (e.g., in case of the first image having a relatively low resolution), noise filtration, focus corrections, aberration compensation, image format transformation, etc.

It is to be noted the present disclosure is not limited to the specific modality of the mask inspection tool, and/or the type of images acquired thereby, and/or the pre-processing operations required for processing the images.

A critical dimension (CD) map of the mask can be generated (204) (e.g., by the PMC 102). The CD map comprises a plurality of composite values of a CD measurement of a pattern of interest (POI), where the plurality of composite values are respectively derived from the plurality of images.

According to certain embodiments, the POI can be selected from a plurality of structural elements on the mask. A structural element used herein can refer to any original object/feature on the mask that has a geometrical shape or geometrical structure with a contour, in some cases combined/superimposed with other object(s) (thereby forming a pattern). Examples of structural elements can include general shape features, such as, e.g., contacts, lines, etc., and/or features having complex structures/shapes, and/or features combined by one or more other features. The POI can thus comprise one or more structural elements selected from the plurality of structural elements on the mask.

By way of example, the POI can be selected based on one or more of the following factors: the type and/or shape of the one or more structural elements, user input regarding the importance of the one or more structural elements with respect to CDU, etc. In some cases, the POI can be predetermined, and in some other cases, it can be selected during the inspection.

The CD measurement can refer to any critical dimension measurement performed with respect to the POI, including but not limiting to the following: dimensions (e.g., line widths, line spacing, contact diameters, size of the element, edge roughness, gray level statistics, etc.), shapes of elements, distances within or between elements, related angles, overlay information associated with elements corresponding to different design levels, etc. In some embodiments, the CD measurement can be selected in accordance with a specific inspection application.

Specifically, a composite value can be derived from each given image of the plurality of images in accordance with the process described with reference to blocks 206—212, as detailed below.

The given image can be divided (206) (e.g., by the image processing module 104 of PMC 102) into a plurality of sections. In some embodiments, the given image can be divided into the plurality of sections according to a grid. The grid is determined based on dimension and periodicity of the POI. By way of example, the grid can be determined such that the size of each section may accommodate at least one POI. In some other embodiments, the given image can be divided unevenly, e.g., according to different design and functionalities of respective mask areas represented in the given image.

Figure 6:
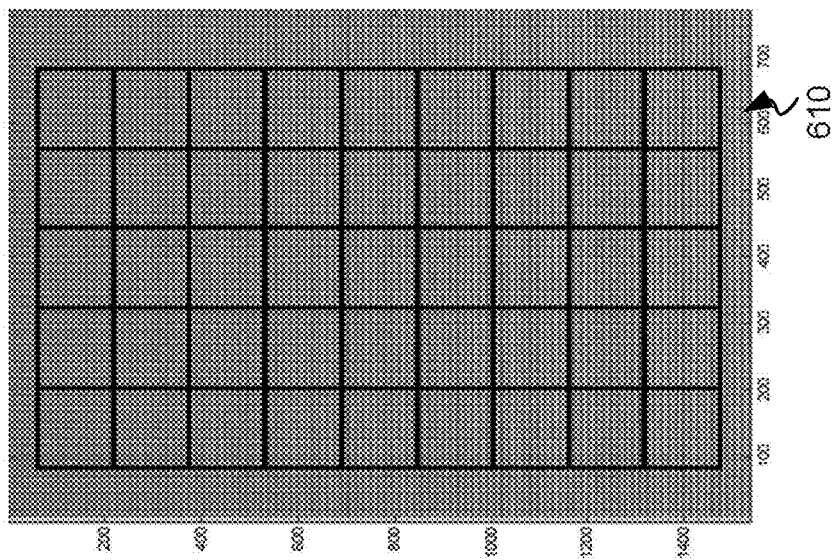
FIG. 6 schematically illustrates an example of a given image and a plurality of sections divided within the given image in accordance with certain embodiments of the presently disclosed subject matter.
Figure 6:
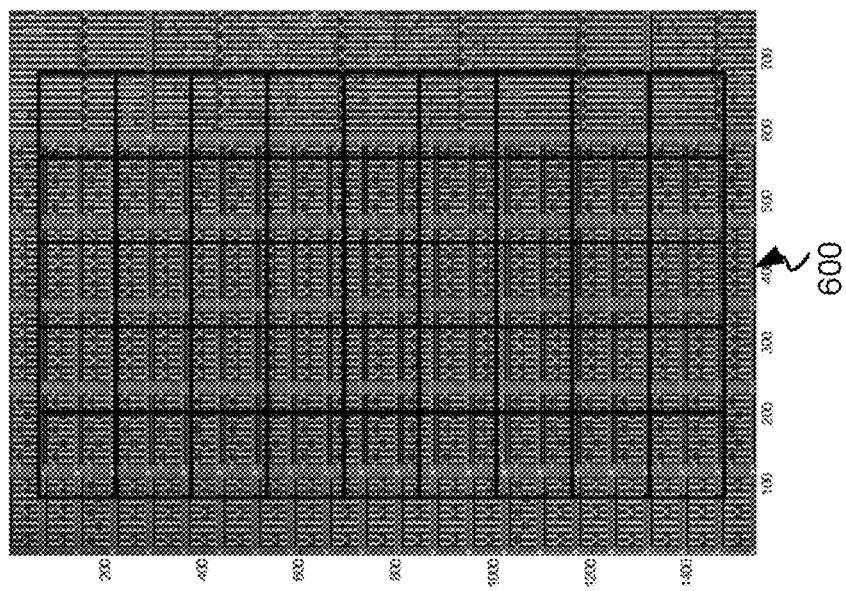

FIG. 6 illustrates an example of a given image and a plurality of sections divided within the given image in accordance with certain embodiments of the presently disclosed subject matter. As shown, image 600 refers to an image (an aerial image) representative of a respective part of a mask (a logic mask in the present example) as acquired by a mask inspection tool. Image 610 illustrates a plurality of sections that are evenly divided in the image 600 in accordance with a grid.

The POI can be searched (208) (e.g., by the image processing module 104 of PMC 102) in the plurality of sections, giving rise to a set of sections each with presence of at least one of the POI therein. In some embodiments, the POI can be searched by using a pattern matching algorithm with respect to a reference image of the POI. In some cases, the reference image of the POI can be derived based on the design data of the POI, or alternatively it can be provided/indicated by the user.

By way of example, for each section, normalized cross correlation with respect to the reference image can be applied to each pixel in the section to identify an optimal matching pixel with a surrounding window that best matches the reference image. The reference image and the identified surrounding window can be aligned, and subtracted one from the other, giving rise to a difference image. The difference image (or at least some pixel values thereof) can be used to determine whether or not the window contains the same pattern as the POI.

Once the search is performed for all the plurality of sections in the given image, a set of sections that are identified with presence of the POI (or at least one of the POI) can be provided.

For each section of the set of sections, a value of the CD measurement with respect to the at least one POI can be obtained (210) (e.g., by the measurement module 106 of PMC 102) using a printing threshold, giving rise to a set of values of the CD measurement corresponding to the set of sections.

Turning now to FIG. 3, there is illustrated a generalized flowchart of one example of obtaining a value of the CD measurement for each section in accordance with certain embodiments of the presently disclosed subject matter.

A printing threshold can be applied (302) on at least a portion of the section comprising the at least one POI, giving rise to a binary image portion. The binary image portion is informative of structural elements/features of a corresponding portion of the mask which are printable on the semiconductor specimen (e.g., the wafer). A printing threshold and the application thereof are now described with reference to FIG. 7.

Figures 7, 8:
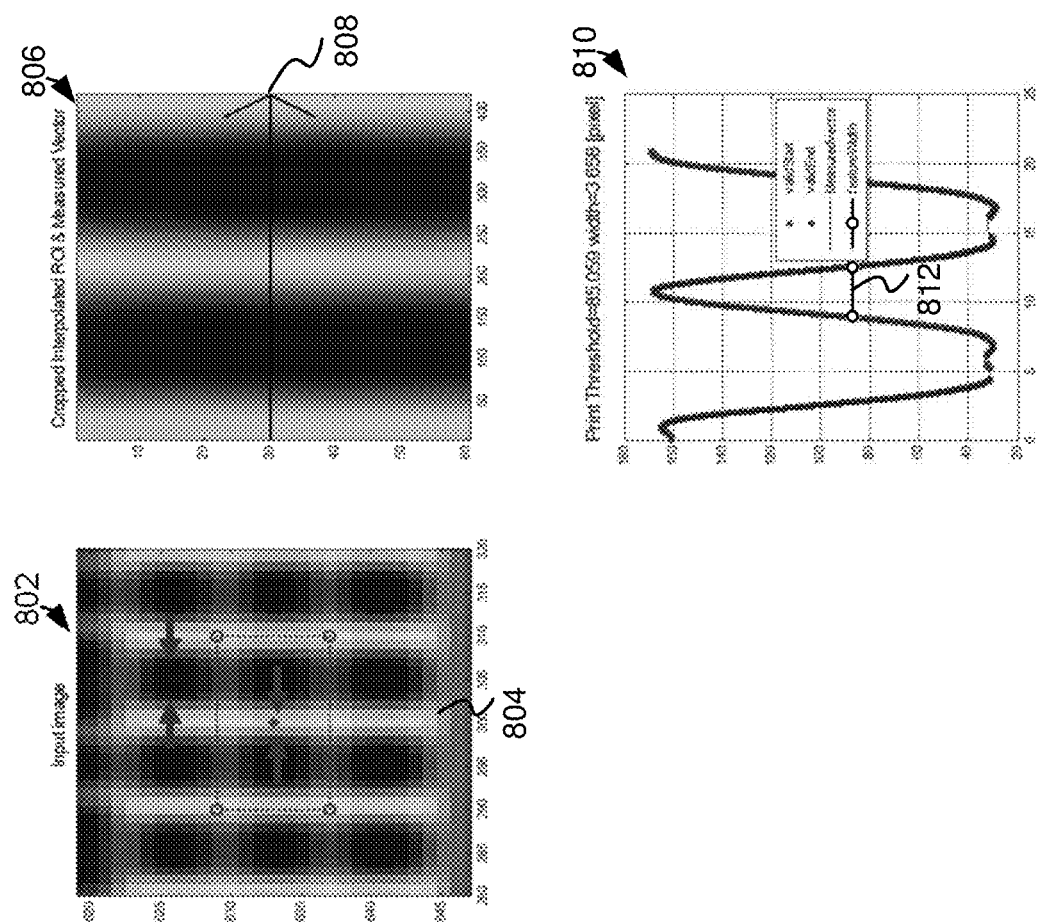
FIG. 7 shows a schematic illustration of the process of applying a printing threshold in accordance with certain embodiments of the presently disclosed subject matter.
FIG. 8 illustrates an exemplified image portion comprising at least one POI and a GL profile derived therefrom in accordance with certain embodiments of the presently disclosed subject matter.

Referring now to FIG. 7, there is shown a schematic illustration of the process of applying a printing threshold in accordance with certain embodiments of the presently disclosed subject matter.

As shown, the illustration 700 demonstrates an exemplified (and simplified) mask comprising a transparent area 702 (e.g., made of quartz) which, upon illumination, transmits the light, and an opaque area 704 (e.g., made of chrome) which blocks the light. The plurality of images (aerial images) obtained as described above refers to images that are captured by a detector collecting the transmitted light through the mask.

In fact, the actual wafer fabrication process by the fabrication tool (e.g., the scanner or stepper) includes a resist process and an etch process following the lithography process. The wafer is coated with photoresist which is a photosensitive material. Exposure to light causes sections of the resist to either harden or soften, depending on the process. After exposure, the wafer is developed, causing the photoresist to dissolve in certain areas according to the amount of transmitted light (i.e., the light intensity) the areas received during exposure.

By way of example, a waveform 705 representative of the intensity of the transmitted light is illustrated. The patterns will be printed on the wafer if the photoresist at a given area is exposed below a specific intensity of the transmitted light. These areas of photoresist and no photoresist reproduce the design patterns on the mask. The specific intensity is therefore known as a printing threshold 705, as exemplified in FIG. 7. The developed wafer is then exposed to solvents which etch away the silicon in the parts of the wafer that are no longer protected by the photoresist coating, giving rise to a printed wafer 708 (for a given layer).

Accordingly, in the actinic inspection tool that mimics the optical configuration of the wafer fabrication tool, the waveform 705 represents the transmitted light that will be captured by the detector of the actinic inspection tool to form the first image. Since in the actinic inspection tool, the detector replaced the wafer and there is no actual resist and etching process, in order to obtain an image that resembles the printed wafer, a printing threshold 705 needs to be applied to the aerial image to mimic the effect of the resist and etching process, giving rise to a binary image which resembles the printed patterns on the wafer 708. Specifically, the binary image is informative of a plurality of structural elements of the mask which are printable on the wafer.

It is to be noted that although in the present example, the patterns below the printing threshold are illustrated as printable on the wafer (i.e., positive resist), this is not necessarily so. In some other cases, it could be the opposite, i.e., the patterns above the printing threshold are printable on the wafer (i.e., negative resist). The present disclosure is not limited to the specific resist process, nor the specific application of the printing threshold, for rendering the printable features.

Referring back to FIG. 3, upon the printing threshold being applied to the at least portion of the section, the binary image portion as described is representative of the printable structural elements/features of a corresponding portion of the mask (i.e., printable on the wafer). The CD measurement can be performed (304) on the binary image portion to obtain the value of the CD measurement. By way of example, assume the POI is a line structure, and the CD measurement is to measure the width of the line. The line width can be obtained by measuring the distance between two edges of the line in the binary image portion.

According to certain embodiments, the CD measurement with respect to the at least one POI for each section can be obtained in alternative ways. FIG. 4 illustrates a generalized flowchart of another example of obtaining a value of the CD measurement for each section in accordance with certain embodiments of the presently disclosed subject matter.

As illustrated, a gray level (GL) profile of the at least one POI can be derived (402) from the section of the image. The GL profile is indicative of pixel intensity distribution of the at least one POI. A printing threshold can be applied (404) on the GL profile to obtain two topo-points. A topo-point refers to a point on a signal profile or waveform (e.g., the GL profile) that is identified to correspond to a specific location on the geometric structure of a mask. For instance, the two topo-points as obtained can be representative of estimated edges/boundaries of the POI (e.g., the edges of a line structure). The CD measurement can be performed (406) based on the two topo-points, to obtain the value thereof.

Referring now to FIG. 8, there is illustrated an exemplified image portion comprising at least one POI and a GL profile derived therefrom in accordance with certain embodiments of the presently disclosed subject matter.

Assume the POI is a line structure in the present example, and the CD measurement of the POI is the width of the line structure. Upon searching for the POI in the plurality of sections in a given image, a set of sections with presence of at least one POI are identified. Image 802 illustrates an image portion within such a section that comprises at least one POI (e.g., the line structure 804). As illustrated, the image 802 comprises image representation of multiple line structures. For each line structure, the gray level intensities vary along the direction perpendicular to the longitudinal axis of the line structure, representing changes of the surface profile of the line in that direction.

In some cases, optionally, an image patch within image 802 comprising one POI can be cropped and interpolated so as to obtain an interpolated patch 806 with relatively higher resolution. The CD measurement can be performed on the interpolated patch 806. By way of example, a GL profile 810 can be derived based on the interpolated patch, e.g., along a measurement vector 808 as exemplified.

As illustrated, a printing threshold (e.g., 87.4 in the present example) is applied on the GL profile 810, giving rise to two topo-points on the GL profile (marked by circles). The two topo-points are representative of estimated edges/boundaries of the line structure. By applying the printing threshold (which is indicative of a specific printing intensity as described above with reference to FIG. 7) to the GL profile, the topo-points are obtained at the least sensitive areas of the GL profile (e.g., areas that are less sensitive to tool energy drifts), thereby enabling to obtain CD measurements with higher accuracy.

The CD measurement can be performed based on the two topo-points. For instance, the line width can be obtained by measuring the distance 812 between the two topo-points. In some cases, as the image 802 may comprise multiple POIs (e.g., multiple line structures as illustrated in the present example), the CD measurement can be obtained for each of the multiple POIs (or at least some thereof). For instance, the line width can be measured for all the line structures (or certain selected line structures therefrom) as presented in the image 802, and an averaged measurement can be obtained based on the multiple line widths.

It is to be noted that the CD measurement implementations as described with reference to FIGS. 3 and 4 are illustrated for exemplary purposes. The present disclosure should not be limited to either implementation, and/or other suitable alternative implementations utilizing the printing threshold.

Referring back to the description of FIG. 2, once the CD measurement is performed and a value of the CD measurement is obtained for each section of the set of sections, a set of values of the CD measurement corresponding to the set of sections are obtained, as described with reference to block 210. The set of values can be combined (212) (e.g., by the measurement module 106) to a composite value of the CD measurement corresponding to the given image. By way of example, the set of values can be combined/aggregated by averaging (or weighted averaging) the set of values based on, e.g., mean or median or any other kinds of averaging calculations (with or without weights).

Once a composite value of the CD measurement of the POI is derived for each given image of the plurality of images, a plurality of composite values corresponding to the plurality of images are obtained. A critical dimension (CD) map of the mask can be generated (204) comprising the plurality of composite values of the CD measurement of the POI. Specifically, the plurality of composite values are positioned in the CD map at locations corresponding to the locations of the respective parts of the mask as represented by the corresponding plurality of images of the mask.

Figure 9:
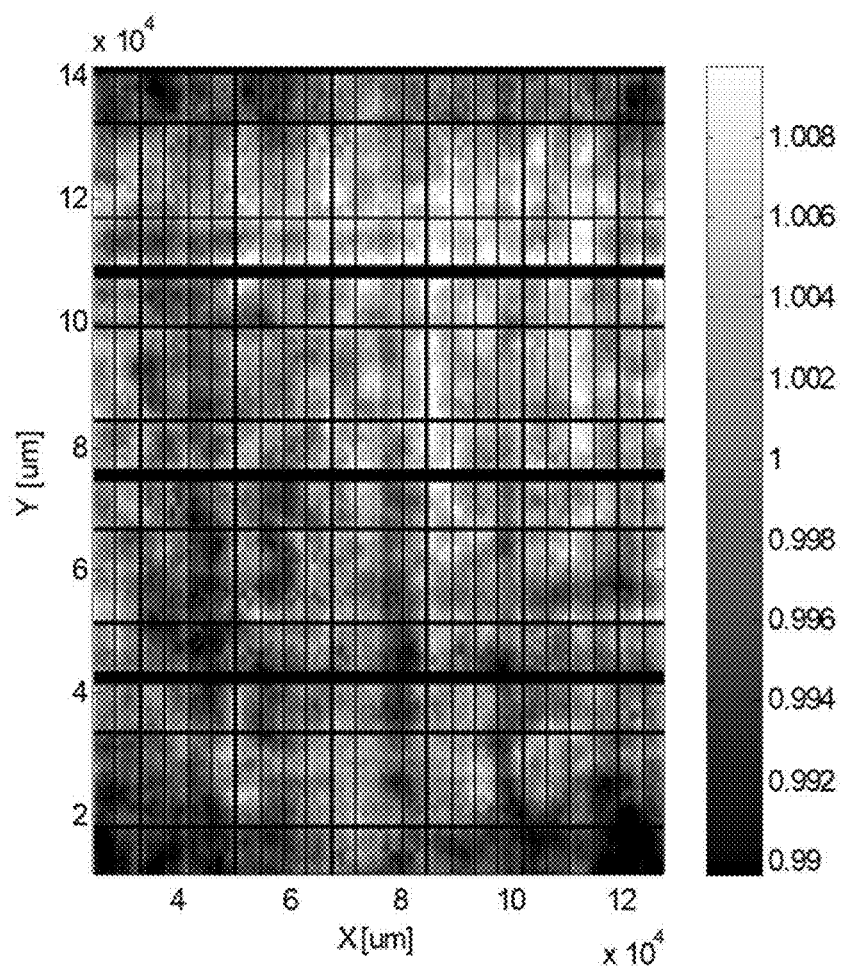
FIG. 9 illustrates an example of a CD map of a mask in accordance with certain embodiments of the presently disclosed subject matter.

The CD map generated as described above can be indicative of CD uniformity of the mask with respect to the CD measurement of the POI. FIG. 9 illustrates an example of a CD map of a mask in accordance with certain embodiments of the presently disclosed subject matter. As shown, there are gray level variances between difference areas in the CD map, indicating the CD variances in the mask.

In some embodiments, CD variances of the mask can be determined (214) (e.g., by the defect reporting module 108) based on the CD map. The CD variance can be compared to a predetermined CDU threshold. Presence of a defect with respect to CDU (also referred to as CDU defect) can be reported upon the CD variance passing the CDU threshold. By way of example, the CD variance can be calculated using a three-sigma methodology. For instance, a CD histogram can be derived based on the CD map, and three-sigma (e.g., three standard deviations of the mean of the population) can be extracted from the CD histogram, which is indicative of the CD variance. In some cases, the CDU threshold can be predetermined in accordance with, e.g., the specific inspection application, the type of CD measurement and/or POI, technology node, and/or specs used by the customer, etc.

Optionally, in some embodiments, in response to the presence of the defect with respect to CDU, it can be further determined how to respond to the CDU defect, e.g., whether to accept the mask, repair the mask, or reject the mask. By way of example, this can be done by, e.g., evaluating whether the CDU defect, upon being printed, will affect the functionality of a semiconductor specimen manufactured using the mask. By way of example, the evaluation can include estimating the CD variations that are associated with the CDU defect when being printed on the semiconductor specimen. In some cases, the possible treatment operations in response to presence of CDU defects can include one or more of the following: repairing the mask, defining the mask as a faulty mask, defining the mask as functional, generating a repair indication of the mask, and the like. For instance, if these estimated CD variations are not acceptable, then the mask can be sent to the mask shop to be repaired or rejected.

Additionally, in some embodiments, at least one of the following output/indications, or any combination thereof can be provided (e.g., by the defect reporting module 108 of the PMC 102): (i) providing a qualification criterion for a mask to be shipped out of a mask shop; (ii) providing input to a mask generation process; (iii) providing input to a semiconductor specimen manufacturing process; (iv) providing input to a simulation model used in a lithographic process; (v) providing correction maps for a lithography tool; and (vi) identifying areas on the mask that are characterized by CD variations which are larger than expected.

In some embodiments, the user may be interested to estimate the CDU with respect to one or more CD measurements of the POI in accordance with a specific inspection application. For instance, in the previous example where the POI is a line structure, the CD measurements of interest based on the inspection application may include line width and the distance between two neighboring lines. In such cases, one or more CD maps can be generated corresponding to the one or more CD measurements of interest of the POI using the process described above with reference to FIG. 2, where each CD map comprises a plurality of composite values of a specific CD measurement of the one or more CD measurements respectively derived from the plurality of images.

Specifically, one or more composite values can be derived from each given image of the plurality of images including, for each section of the set of sections, obtaining one or more values for the one or more CD measurements, giving rise to one or more sets of values for the one or more CD measurements corresponding to the set of sections, and respectively combining each set of the one or more sets of values to one or more composite values corresponding to the given image.

Accordingly, once the one or more CD maps are generated, one or more CD variances with respect to the one or more CD measurements can be respectively determined based on the one or more CD maps, and presence of a CDU defect can be respectively determined based on the respective CD variances with respect to respective CDU thresholds.

It is to be noted that the mask that is applicable to the presently disclosed inspection method can be any kind of mask that may suffer from the type of CDU defect as described herein, including but not limited to memory masks and/or logic masks, and/or Arf masks and/or EUV masks, etc. The present disclosure is not limited to a specific type or functionality of the masks to be inspected.

For exemplary and illustrative purposes, certain embodiments and/or examples of the presently disclosed subject matter herein are described with respect to a specific POI as a line structure, and specific CD measurements thereof. This is by no means intended to limit the present disclosure in any way. It is appreciated that the proposed methods and systems can be applied to other types/shapes of POIs with specific CD measurements of interest thereof. By way of example, in case of the POI being a contact, the CD measurements associated therewith can include one or more of the following: the diameter of a contact, the distance between different contacts, etc.

According to certain embodiments, the mask inspection process as described above with reference to FIGS. 2, 3 and 4 can be included as part of an inspection recipe usable by system 101 and/or the inspection tool 120 for online mask inspection in runtime. Therefore, the presently disclosed subject matter also includes a system and method for generating an inspection recipe during a recipe setup phase, where the recipe comprises the steps as described with reference to FIGS. 2, 3 and 4 (and various embodiments thereof). It is to be noted that the term "inspection recipe" should be expansively construed to cover any recipe that can be used by an inspection tool for performing operations related to any kind of mask inspection including the embodiments as described above.

It is to be noted that examples illustrated in the present disclosure, such as, e.g., the mask inspection tool architectures and configurations, the mask types and/or layouts, the exemplified POIs and/or CD measurements, and the specific ways of CD measurement implementations as described above, etc., are illustrated for exemplary purposes, and should not be regarded as limiting the present disclosure in any way. Other appropriate examples/implementations can be used in addition to, or in lieu of the above.

Among advantages of certain embodiments of the mask inspection process as described herein is the capability of estimating CD uniformity of a mask (or at least part thereof) and detecting a defect with respect to CDU (i.e., CDU defect) on a mask prior to mass production of wafers in the FAB.

Among advantages of certain embodiments of the mask inspection process as described herein is that the proposed inspection process does not rely on the known linear correlation relationship between CD measurements and pixel intensity of a mask image, therefore does not require to learn the correlation coefficient k which is typically unknown and complicated to learn, as it varies with respect to many factors such as, e.g., the pattern of interest, the type of resist, etc. The CD map as derived using the proposed inspection process can directly represent the values of the CD measurements.

The proposed inspection process is applicable to both logic masks and memory masks, as it searches the specific POI in the plurality of sections in an image, and derives the actual CD measurement with respect to the POI in the detected sections, unlike previous approaches which derive averaged pixel intensities over an image section, thus are only applicable to memory masks where the features are repetitive within the averaging area and across the mask.

Among advantages of certain embodiments of the mask inspection process as described herein is that by applying a printing threshold (which is indicative of a specific printing intensity) to an image portion comprising the at least one POI (or applying the printing threshold to the GL profile thereof), the measurements can be obtained at the least sensitive areas of the GL profile (e.g., areas that are less sensitive to tool energy drifts), thereby enabling to obtain CD measurements with improved sensitivity and accuracy.

It is to be understood that the present disclosure is not limited in its application to the details set forth in the description contained herein or illustrated in the drawings.

It will also be understood that the system according to the present disclosure may be, at least partly, implemented on a suitably programmed computer. Likewise, the present disclosure contemplates a computer program being readable by a computer for executing the method of the present disclosure. The present disclosure further contemplates a non-transitory computer-readable memory tangibly embodying a program of instructions executable by the computer for executing the method of the present disclosure.

The present disclosure is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the present disclosure as hereinbefore described without departing from its scope, defined in and by the appended claims.

What is claimed is:

1. A computerized system of inspecting a mask usable for fabricating a semiconductor specimen, the system comprising a processing and memory circuitry (PMC) configured to:
    obtain a plurality of images each representative of a respective part of the mask, wherein the plurality of images are acquired by an actinic inspection tool to emulate optical configuration of a lithographic tool usable for fabrication of the semiconductor specimen, the plurality of images resembling images of a semiconductor specimen that would be fabricated using the mask;
    generate a critical dimension (CD) map of the mask representative of direct CD measurements from the plurality of images, the CD map comprising a plurality of composite values of a CD measurement of a pattern of interest (POI) respectively derived from the plurality of images, wherein the PMC is configured to derive a composite value from each given image of the plurality of images by:
        dividing the given image into a plurality of sections;
        searching for the POI in the plurality of sections, giving rise to a set of sections each with presence of at least one of the POI therein;
        for each section of the set of sections, obtaining a value of the CD measurement with respect to the at least one POI by applying a printing threshold usable for rendering printable patterns on the semiconductor specimen, giving rise to a set of values of the CD measurement corresponding to the set of sections; and
        combining the set of values to a composite value of the CD measurement corresponding to the given image;
    wherein the CD map is used to determine CD uniformity (CDU) of the mask with respect to the CD measurement of the POI.

2. The computerized system according to claim 1, wherein the mask is a memory mask or a logic mask.

3. The computerized system according to claim 1, wherein the CD measurement is selected in accordance with a specific inspection application.

4. The computerized system according to claim 1, wherein the given image is divided into the plurality of sections according to a grid, and the grid is determined based on dimension and periodicity of the POI.

5. The computerized system according to claim 1, wherein the POI is searched by using a pattern matching algorithm with respect to a reference image of the POI.

6. The computerized system according to claim 1, wherein the PMC is configured to obtain the value of the CD measurement for each section by: deriving a gray level (GL) profile of the at least one POI from the section, the GL profile indicative of pixel intensity distribution of the at least one POI, applying the printing threshold on the GL profile to obtain two topo-points, and performing the CD measurement based on the two topo-points to obtain the value thereof.

7. The computerized system according to claim 1, wherein the PMC is configured to obtain the value of the CD measurement for each section by: applying the printing threshold on at least a portion of the section comprising the at least one POI, giving rise to a binary image portion, and performing the CD measurement on the binary image portion to obtain the value thereof.

8. The computerized system according to claim 1, wherein the PMC is configured to generate one or more CD maps corresponding to one or more CD measurements of the POI in accordance with a specific inspection application, each CD map comprising a plurality of composite values of a CD measurement of the one or more CD measurements respectively derived from the plurality of images; and
    wherein the PMC is configured to derive one or more composite values from each given image of the plurality of images including, for each section of the set of sections, obtaining one or more values for the one or more CD measurements, giving rise to one or more sets of values for the one or more CD measurements corresponding to the set of sections, and respectively combining each set of the one or more sets of values to one or more composite values corresponding to the given image.

9. The computerized system according to claim 1, wherein the PMC is further configured to determine CD variance of the mask based on the CD map, and report presence of a defect with respect to CDU upon the CD variance passing a CDU threshold.

10. The computerized system according to claim 9, wherein the PMC is further configured to determine whether to accept the mask, correct the mask, or reject the mask in response to the presence of the defect with respect to CDU.

11. A computerized method of inspecting a mask usable for fabricating a semiconductor specimen, the method performed by a processing and memory circuitry (PMC) and comprising:
 obtaining a plurality of images each representative of a respective part of the mask, wherein the plurality of images are acquired by an actinic inspection tool to emulate optical configuration of a lithographic tool usable for fabrication of the semiconductor specimen, the plurality of images resembling images of a semiconductor specimen that would be fabricated using the mask;
 generating a critical dimension (CD) map of the mask representative of direct CD measurements from the plurality of images, the CD map comprising a plurality of composite values of a CD measurement of a pattern of interest (POI) respectively derived from the plurality of images, comprising deriving a composite value from each given image of the plurality of images by:
  dividing the given image into a plurality of sections;
  searching for the POI in the plurality of sections, giving rise to a set of sections each with presence of at least one of the POI therein;
  for each section of the set of sections, obtaining a value of the CD measurement with respect to the at least one POI by applying a printing threshold usable for rendering printable patterns on the semiconductor specimen, giving rise to a set of values of the CD measurement corresponding to the set of sections; and
  combining the set of values to a composite value of the CD measurement corresponding to the given image;
 wherein the CD map is used to determine CD uniformity (CDU) of the mask with respect to the CD measurement of the POI.

12. The computerized method according to claim 11, wherein the POI is searched by using a pattern matching algorithm with respect to a reference image of the POI.

13. The computerized method according to claim 11, wherein the obtaining the value of the CD measurement comprises: deriving a gray level (GL) profile of the at least one POI from the section, the GL profile indicative of pixel intensity distribution of the at least one POI, applying the printing threshold on the GL profile to obtain two topo-points, and performing the CD measurement based on the two topo-points to obtain the value thereof.

14. The computerized method according to claim 13, wherein the obtaining the value of the CD measurement comprises: applying the printing threshold on at least a portion of the section comprising the at least one POI, giving rise to a binary image portion, and performing the CD measurement on the binary image portion to obtain the value thereof.

15. The computerized method according to claim 11, comprising generating one or more CD maps corresponding to one or more CD measurements of the POI in accordance with a specific inspection application, each CD map comprising a plurality of composite values of a CD measurement of the one or more CD measurements respectively derived from the plurality of images, comprising deriving one or more composite values from each given image of the plurality of images including:
 for each section of the set of sections, obtaining one or more values for the one or more CD measurements, giving rise to one or more sets of values for the one or more CD measurements corresponding to the set of sections, and respectively combining each set of the one or more sets of values to one or more composite values corresponding to the given image.

16. A non-transitory computer readable storage medium tangibly embodying a program of instructions that, when executed by a computer, cause the computer to perform a method of inspecting a mask usable for fabricating a semiconductor specimen, the method comprising:
 obtaining a plurality of images each representative of a respective part of the mask, wherein the plurality of images are acquired by an actinic inspection tool to emulate optical configuration of a lithographic tool usable for fabrication of the semiconductor specimen, the plurality of images resembling images of a semiconductor specimen that would be fabricated using the mask;
 generating a critical dimension (CD) map of the mask representative of direct CD measurements from the plurality of images, the CD map comprising a plurality of composite values of a CD measurement of a pattern of interest (POI) respectively derived from the plurality of images, comprising deriving a composite value from each given image of the plurality of images by:
  dividing the given image into a plurality of sections;
  searching for the POI in the plurality of sections, giving rise to a set of sections, each with presence of at least one of the POI therein;
  for each section of the set of sections, obtaining a value of the CD measurement with respect to the at least one POI by applying a printing threshold usable for rendering printable patterns on the semiconductor specimen, giving rise to a set of values of the CD measurement corresponding to the set of sections; and
  combining the set of values to a composite value of the CD measurement corresponding to the given image;
 wherein the CD map is used to determine CD uniformity (CDU) of the mask with respect to the CD measurement of the POI.

* * * * *